United States Patent [19]

Fukuzawa et al.

[11] Patent Number: 4,691,364
[45] Date of Patent: Sep. 1, 1987

[54] BIT PATTERN CONVERSION APPARATUS

[75] Inventors: Takahiko Fukuzawa; Kiyoshi Kitahara, both of Tokyo, Japan

[73] Assignee: Citizen Watch Co., Ltd., Tokyo, Japan

[21] Appl. No.: 701,220

[22] Filed: Feb. 13, 1985

[30] Foreign Application Priority Data

Feb. 15, 1984 [JP] Japan ................................ 59-24949

[51] Int. Cl.$^4$ ............................................. G06K 9/36
[52] U.S. Cl. ..................................... 382/41; 364/900; 382/44
[58] Field of Search ...................... 382/44, 46, 47, 41; 364/200 MS File, 900 MS File

[56] References Cited

U.S. PATENT DOCUMENTS

| | | | |
|---|---|---|---|
| 3,976,982 | 8/1976 | Eiselen | 382/44 |
| 4,052,699 | 10/1977 | Micka et al. | 382/46 |
| 4,168,488 | 9/1979 | Evans | 382/46 |

FOREIGN PATENT DOCUMENTS

| | | | |
|---|---|---|---|
| 0081096 | 6/1983 | European Pat. Off. | 382/46 |
| 0119689 | 9/1984 | European Pat. Off. | 382/41 |
| 867738 | 5/1961 | United Kingdom | 382/41 |
| 1468486 | 3/1977 | United Kingdom | 382/41 |
| 773457 | 4/1977 | United Kingdom | 382/41 |
| 2012088A | 7/1979 | United Kingdom | 382/47 |
| 1576439 | 10/1980 | United Kingdom | 382/41 |
| 2043312 | 10/1980 | United Kingdom | 382/46 |

OTHER PUBLICATIONS

Gold, "Shift Register Implemented Image Rotator/Transposer", *IBM Tech. Disc. Bulletin*, vol. 17, #10, Mar. 1975, pp. 3026–3028.

*Primary Examiner*—Leo H. Boudreau
*Assistant Examiner*—Joseph Mancuso
*Attorney, Agent, or Firm*—Lowe Price LeBlanc Becker & Shur

[57] ABSTRACT

A bit pattern conversion apparatus has bit vertical/horizontal conversion means for converting data at the same bit positions of n-bit data into n-bit data, double expansion conversion means for converting 1-bit data into 2-bit data and producing the 2-bit data, bit number conversion means for converting 8-bit data into 6-bit data, and MSB/LSB conversion means for performing MSB/LSB conversion. The bit pattern of data stored in the memory means by the decoder means is converted by each conversion means.

5 Claims, 17 Drawing Figures

FIG.1

|  | B ↑ READ |  |  |  |  |  |  |  |
|---|---|---|---|---|---|---|---|---|
| b00 | b10 | b20 | b30 | b40 | b50 | b60 | b70 | 0 |
| b01 | b11 | b21 | b31 | b41 | b51 | b61 | b71 | 1 |
| b02 | b12 | b22 | b32 | b42 | b52 | b62 | b72 | 2 |
| b03 | b13 | b23 | b33 | b43 | b53 | b63 | b73 | 3 |
| b04 | b14 | b24 | b34 | b44 | b54 | b64 | b74 | 4 |
| b05 | b15 | b25 | b35 | b45 | b55 | b65 | b75 | 5 |
| b06 | b16 | b26 | b36 | b46 | b56 | b66 | b76 | 6 |
| b07 | b17 | b27 | b37 | b47 | b57 | b67 | b77 | 7 |
| 0 | 1 | 2 | 3 | 4 | 5 | 6 | 7 |  |

A → WRITE   COLUMN →   ↑ ROW

FIG.2

|  | b7 | b6 | b5 | b4 | b3 | b2 | b1 | b0 |
|---|---|---|---|---|---|---|---|---|
| i | d7 | d6 | d5 | d4 | d3 | d2 | d1 | d0 |
| ii | d0 | d1 | d2 | d3 | d4 | d5 | d6 | d7 |

FIG. 3 i

| d7 | d6 | d5 | d4 | d3 | d2 | d1 | d0 | ii

| d3 | d3 | d2 | d2 | d1 | d1 | d0 | d0 |
| d7 | d7 | d6 | d6 | d5 | d5 | d4 | d4 |

FIG. 4 i

| d7 | d6 | d5 | d4 | d3 | d2 | d1 | d0 |
| d15 | d14 | d13 | d12 | d11 | d10 | d9 | d8 |
| d23 | d22 | d21 | d20 | d19 | d18 | d17 | d16 | ii

| 1 | 1 | d5 | d4 | d3 | d2 | d1 | d0 |
| 1 | 1 | d11 | d10 | d9 | d8 | d7 | d6 |
| 1 | 1 | d17 | d16 | d15 | d14 | d13 | d12 |
| 1 | 1 | d23 | d22 | d21 | d20 | d19 | d18 |

BIT PATTERN CONVERSION APPARATUS

BACKGROUND OF THE INVENTION

1. Field of the Invention

The present invention relates to a bit pattern conversion apparatus for dot image data and, more particularly, to a conversion apparatus for converting an input bit pattern into an output bit pattern compatible with a printer or a CRT display unit.

2. Description of the Prior Art

Terminals connected to computers process dot image data in a vertical or horizontal direction. For example, among dot printers, a line printer processes dot image data in the horizontal direction while a serial printer processes dot image data in the vertical direction. For this reason, output to be supplied to a hammer of a printer must be horizontal data in the case of a line printer and vertical data in the case of a serial printer. When data supplied from a host computer is data compatible with a line printer but a printer to be used is a serial printer (or vice versa), the data output sequence must be changed for compatibility with an available printer. This also applies to a character generator or a CRT display unit. When a character generator outputs vertical data and the data must be outputted by a CRT display unit or a line printer capable of processing horizontal data, the vertical data must be converted into horizontal data.

When input data sent from a most significant bit (to be referred to as an MSB hereinafter) is to be processed by a terminal such as a printer and if the printer is to read and process such input data from a least significant bit (to be referred to as an LSB hereinafter) (or vice versa), MSB/LSB conversion must be performed.

When a printing output is to be double expanded or 8-bit input image data is to be processed in 6-bit blocks, an input bit pattern must be converted into a pattern which can be processed by a terminal.

Such vertical/horizontal conversion, MSB/LSB conversion, expansion (doubling), and bit pattern conversion from an 8-bit pattern into a 6-bit pattern are conventionally performed by a program. However, such conversion is time-consuming and delays printing or display.

SUMMARY OF THE INVENTION

It is a first object of the present invention to provide a bit pattern conversion apparatus capable of converting a bit pattern of dot image data.

It is a second object of the present invention to provide a bit pattern conversion apparatus capable of converting a bit pattern of input dot image data from a vertical bit pattern into a horizontal bit pattern or vice versa.

It is a third object of the present invention to provide a bit pattern conversion apparatus for performing MSB/LSB conversion of input dot image data.

It is a fourth object of the present invention to provide a bit pattern conversion apparatus for expanding an input bit pattern into a double size and outputting the expanded pattern.

It is a fifth object of the present invention to provide a bit pattern conversion apparatus for converting 8-bit pattern dot image data into 6-bit pattern dot image data.

Functions of the bit pattern conversion apparatus of the present invention to achieve the above objects will be described below.

Vertical/horizontal conversion of bit pattern will be described with reference to a table shown in FIG. 1.

Referring to FIG. 1, when 8-bit data is written in a memory (bits b00–b77), column 0 is selected, for example, and data is written in the order of b00, b01, b02, . . . , b07 and data is similarly written in the remaining columns. In this manner, data is written in the direction indicated by arrow A in FIG. 1. When vertical/horizontal conversion is performed, the data is read out in the direction indicated by arrow B in FIG. 1. More specifically, when data is read out, row 0 is selected, for example, and data is read out in the order of b00, b10, b20, . . . , b70, thereby performing vertical/horizontal conversion of the bit pattern.

In MSB/LSB conversion, as shown in FIG. 2i, when data is written, MSB data d7 is written in bit b7 and LSB data d0 is written in bit b0. When data is read out, as shown in FIG. 2ii, data d7 is read out from bit b0 and data d0 is read out from bit b7, thereby performing MSB/LSB conversion.

When a bit pattern is expanded into a double size, as shown in FIG. 3i, each bit of data d0 to d7 is written in each bit of the memory. However, when the data is read out, as shown in FIG. 3ii, 1-bit data is read out twice as 2-bit data. Upon this data conversion, a character which is twice the size of the input data can be printed.

In data conversion from an 8-bit pattern into a 6-bit pattern, as shown in FIG. 4i, when each row of 8-bit data d0 to d7, d8 to d15, or d16 to d23 is read out, only 6-bit data in each row is read out and the remaining two bits are set at "1". In other words, data d0 to d5 is treated as one row, and data d6 to d11 is read out for the next row. Readout data becomes as shown in FIG. 4ii. This type of conventional pattern conversion is carried out in a host to computer interface on data wherein dot image data and character data are mixed, and wherein one pattern of such data includes an image start code followed by data indicative of a number of bytes of image data and another pattern includes image start and end codes together with a combination of image and control date. The two logic "1" data in each row of FIG. 4ii make it possible to distinguish image data from control data, even though both types of data are in an eight-bit format.

In order to achieve the above objects and functions of the present invention, there is provided a bit pattern conversion apparatus comprising:

memory means having m n-bit memory elements;

decoder means for outputting a write command for accessing said memory elements so as to write n-bit data received through a data bus into said memory elements of said memory means and for outputting a data read command for data read from said memory means;

bit vertical/horizontal conversion means for converting data stored at the same bit positions of said memory means into n-bit data;

double expansion conversion means for expanding 1-bit data of n-bit data into 2-bit data;

bit number conversion means for dividing each of sequentially input 8-bit data into 6-bit data and setting remaining 2 bits at "1" so as to output 6-bit pattern data; and MSB/LSB conversion means for converting an input n-bit pattern such that a most significant bit or a least significant bit of the n-bit pattern data is a least significant bit or a most significant bit in an output bit pattern, whereby data read out by said decoder means is supplied to one or more of said bit vertical/horizontal conversion means, said double expansion conversion means, said bit number conversion means, and said MSB/LSB conversion means so as to convert a bit pattern of the data.

According to the conversion apparatus of the present invention, the bit pattern of input vertical data can be automatically converted into data of a horizontal bit pattern. Therefore, data for a serial dot printer can be used to automatically drive a line printer. Bit pattern conversion by means of a program is not required as in a conventional apparatus, so that time required for such conversion can be omitted and processing speed can be increased.

Furthermore, since MSB/LSB conversion, double expansion, and 8- to 6-bit conversion can be automatically performed, the bit pattern of input data can be converted into a desired bit pattern automatically, and processing speed can be improved over conventional systems.

BRIEF DESCRIPTION OF THE DRAWINGS

FIG. 1 is a table for explaining vertical/horizontal conversion of a bit pattern according to the present invention;

FIG. 2 is a table for explaining MSB/LSB conversion according to the present invention;

FIG. 3 is a table for explaining double expansion according to the present invention;

FIG. 4 is a table for explaining conversion of an 8-bit pattern into a 6-bit pattern;

FIGS. 13, 13a and 13b are a circuit diagram of an AND module ANM2;

DETAILED DESCRIPTION OF THE PREFERRED EMBODIMENT

An embodiment of a bit pattern conversion apparatus of the present invention will be described in detail hereinafter.

An application system of a bit pattern conversion apparatus according to an embodiment of the present invention will first be described with reference to FIG. 5.

Figure 5:
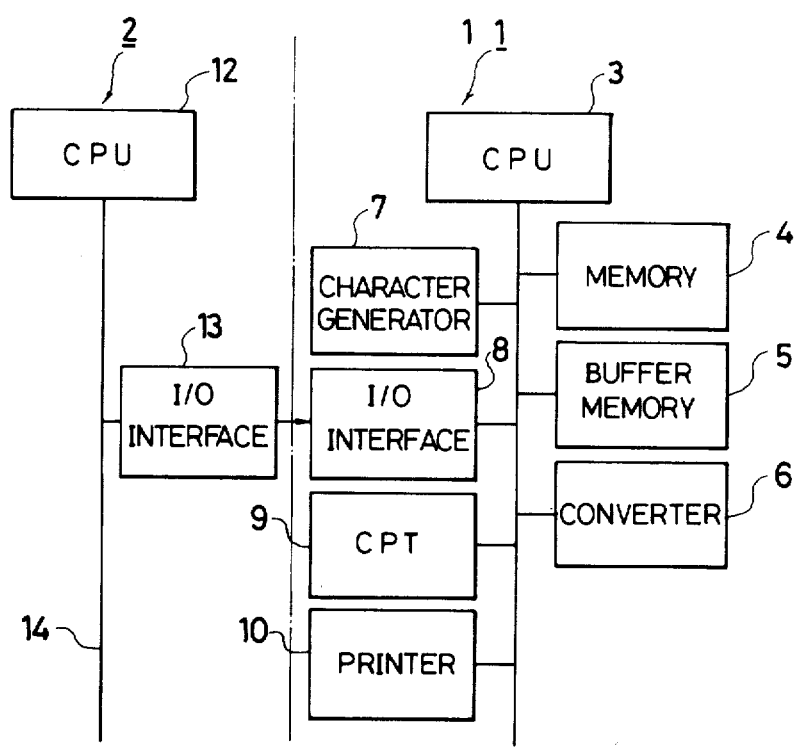
FIG. 5 is a block diagram of an application system of a bit pattern conversion apparatus of the present invention.

Referring to FIG. 5, reference numeral 2 denotes a host computer; 1, a terminal; and 3 and 12, central processing units (to be referred to as a CPU hereinafter). Reference numeral 4 denotes a memory for storing a control program of the terminal; and 5, a buffer memory for storing data supplied from the host computer 2 through I/O interfaces 13 and 8. Reference numeral 6 denotes a bit pattern conversion apparatus according to the present invention; 9, a CRT display unit; 10, a printer; and 11 and 14, buses.

In the apparatus of the configuration described above, when the bit pattern conversion apparatus according to the present invention is not present and data supplied from the host computer 2 is vertical data and when the printer 10 is a line printer, vertical/horizontal conversion is performed by a control program stored in the memory 4 and converted data is outputted for printing. However, with the apparatus of the present invention, the bit pattern is automatically converted by writing and reading the bit pattern from the CPU 3 into or from the bit pattern conversion apparatus 6. The CPU 3 outputs the converted data to the printer or the CRT display unit. When an output from a character generator has a different pattern from that of an input pattern of the printer, the bit pattern conversion apparatus 6 can perform bit pattern conversion.

Figure 6:
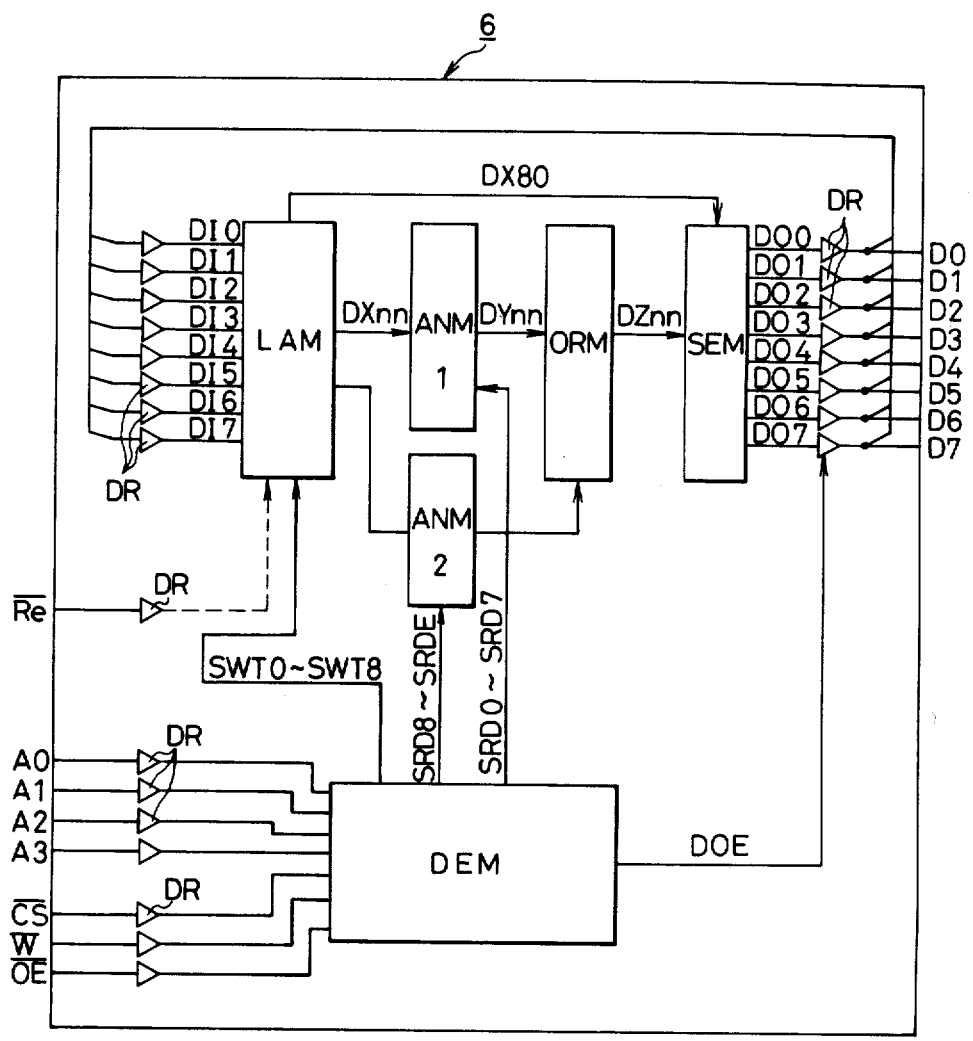
FIG. 6 is a block diagram of a decoder means.

FIG. 6 shows a block diagram of the bit pattern conversion apparatus 6. Referring to FIG. 6, reference symbol DEM denotes decoder means; LAM, a latch module having a plurality of memory elements for storing data and constituting a memory means; ANM1 and ANM2, AND modules constituting various bit conversion means to be described later; ORM, an OR module constituting an OR circuit; SEM, a select module constituting an MSB/LSM conversion means; and DR, drivers. Reference symbols A0 to A3 denote address signals; $\overline{CS}$, a chip select signal; $\overline{W}$, a write signal; $\overline{OE}$, an output enable signal; and $\overline{Re}$, a reset signal. These signals are connected to corresponding input terminals. Reference symbols D0 to D7 denote data buses. The decoder means DEM receives the address signals A0 to A3, the chip select signal $\overline{CS}$, the write signal $\overline{W}$, and the output enable signal OE which are sent from the CPU 3. The decoder means DEM supplies select write signals SWT0 to SWT8 representing a write address for writing data from the data buses D0 to D7 into the latch module LAM to the latch module LAM, select read signals SRD0 to SRD7 and SRD8 to SRDE representing a read address for reading data from the latch module LAM to the AND modules ANM1 and ANM2, and a data output enable signal DOE for instructing data output or input from or to the data buses D0 to D7. The AND module ANM1 is a bit vertical/horizontal conversion means for performing vertical/horizontal conversion of data DXnn read out from the latch module LAM, as shown in FIG. 1. The AND module ANM2 has a double expansion conversion means for performing double expansion conversion and a bit number conversion means for performing conversion from an 8-bit pattern into a 6-bit pattern. The OR module ORM ORs outputs from the AND modules ANM1 and ANM2. The select module SEM of the MSB/LSB conversion means performs MSB/LSB conversion.

The configuration of the decoder means DEM described above will be described with reference to FIGS. 7 and 8.

Figure 7:
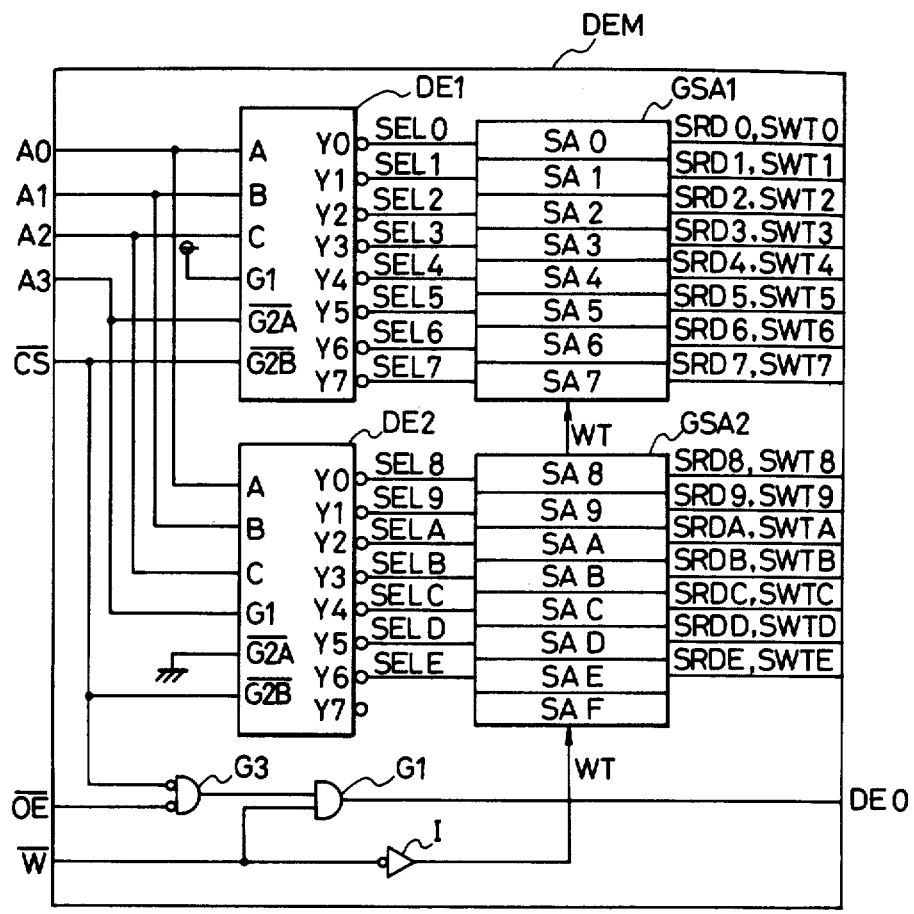
FIG. 7 is a circuit diagram of the decoder means.
Figure 8:
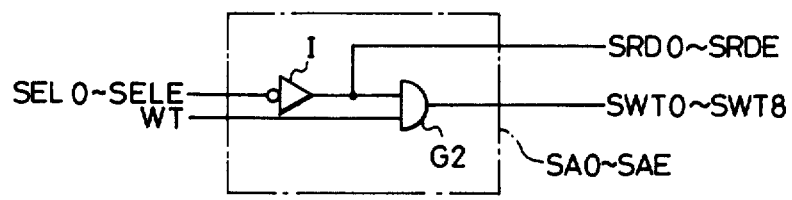
FIG. 8 is a circuit diagram of a gate segment.

Referring to FIG. 7, reference symbols DE1 and DE2 denote decoders which receive the address signals A0 to A3 and generate latch address signals SEL0 to SELE for writing or reading data into or from the latch module LAM as a memory means. Reference symbols GSA1 and GSA2 denote gate modules which generate select write signals SWT0 to SWT8 (select write signals SWT9 to SWTE are not utilized) and select read signals SRD0 to SRDE in response to the address signals SEL0 to SELE. Each of the gate modules GSA1 and GSA2 has 8 gate segments (SA0 to SA7 and SA8 to SAF). Reference symbol I denotes an inverter; G1 to G3, AND gates; and WT, an inverted signal of the write signal $\overline{W}$, i.e., a write command signal. When the address signals A0, A1, A2 and A3 from the CPU 3 are "0", "0", "0", and "0", respectively, the latch address signal SEL0 from the decoder DE1 is "0" and the remaining address signals SEL1 to SELE therefrom are "1". Since the latch address signal SEL0 has been inverted by an inverter I, the gate segment SA0 of the gate module GSA1 produces the select read signal SRD0 of level "1". Since the remaining latch address signals SEL1 to SELE are "1", the remaining select read signals SRD1 to SRDE are "0". The select read signals SRD1 to SRD7 and SRD8 to SRDE are supplied to the AND modules ANM1 and ANM2. Address 0 of the latch module LAM is selected and data is read out therefrom. If the write command signal WT is supplied, only the select write signal SWT0 is at level "1", and data is written at address 0 of the latch module LAM. Similarly, if the address signals A0, A1, A2 and A3 from the CPU 3 are "0", "0", "0", and "1", only the latch address signal SEL8 is "0", only the select read signal SRD8 and the select write signal SWT8 (only when the write command signal WT is supplied) are produced, and address 8 of the latch module LAM is selected. In a similar manner, 15 latch address signals SEL0 to SELF can be produced by 4-bit address signals A0, A1, A2 and A3. However, in this embodiment, the last latch address signal SELF is not used. Note also that the select write signals SWT9 to SWTE from the gate segments SA9 to SAE of the gate module GSA2 are not used.

When the chip select signal $\overline{CS}$ and the output enable signal $\overline{OE}$ are "0" and the write signal $\overline{W}$ is "1", the data output enable signal DOE is produced.

Figure 9:
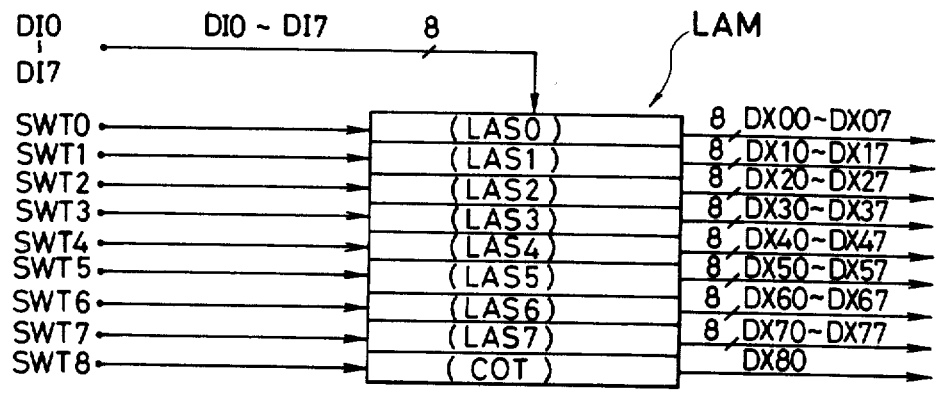
FIG. 9 is a circuit diagram of a latch module.
Figure 10:
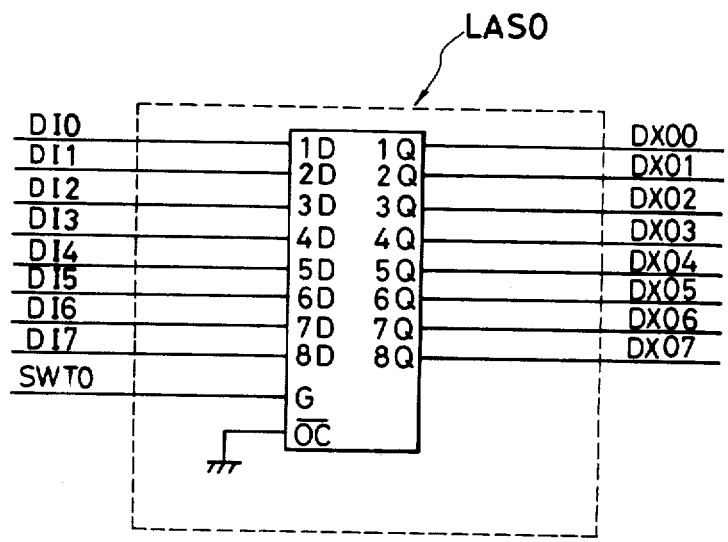
FIG. 10 is a circuit diagram of a latch.

The latch module LAM as a memory means will be described with reference to FIGS. 9 and 10.

The latch module LAM consists of 8 latches LAS0 to LAS7 as memory elements and a single control latch COT (the control latch is a 1-bit latch 1). The respective latches LAS0 to LAS7 receive data input signals DI0 to DI7, as shown in FIG. 10. Terminals G of the respective latches LAS0 to LAS7 receive the select write signals SWT0 to SWT7, respectively. FIG. 10 illustrates an example of the latch LAS0. The terminal G of the latch LAS0 receives the select write signal SWT0 of latch address 0. When the decoder means DEM produces the select write signal SWT0 of latch address 0, the latch LAS0 of the latch module LAM is selected and receives the data D0 to D7. Similarly, when the decoder means DEM produces the select write signal SWT1 of latch address 1, the data D0 to D7 are latched in the latch LAS1. When the decoder means DEM produces the select write signal SWT2, the latch LAS2 latches the data D0 to D7, and so on.

Figure 11:
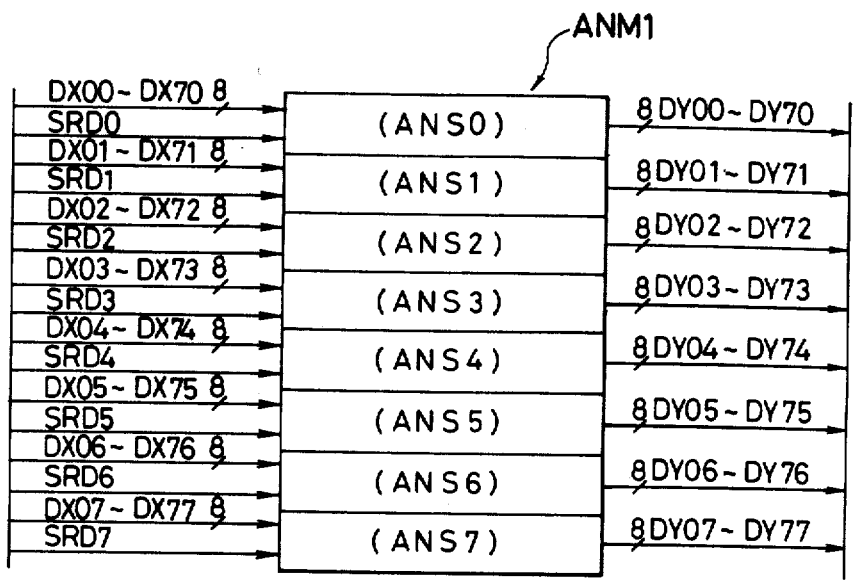
FIG. 11 is a circuit diagram of an AND module ANM1.

The AND module ANM1 as a bit vertical/horizontal conversion means will be described with reference to FIGS. 11 and 12.

Figure 12:
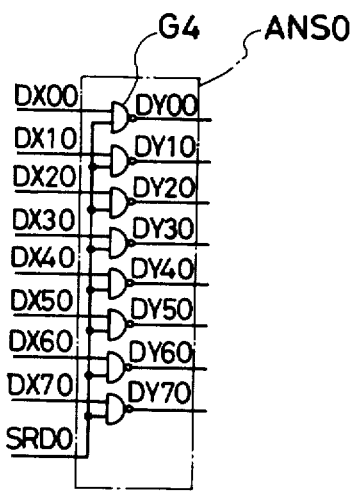
FIG. 12 is a circuit diagram of a gate circuit.

As shown in FIG. 12, the AND module ANM1 comprises 8 gate circuits ANS0 to ANS7 each consisting of 8 NAND gates G4 (FIG. 12 shows an example of the gate circuit ANS0). One input terminal of each NAND gate G4 of the gate circuit ANS0 receives the select read signal SRD0 of read address 0. One input terminal of each NAND gate G4 of the gate circuit ANS1 receives the select read signal SRD1 of read address 1, and so on. Finally, one input terminal of each NAND gate G4 of the gate circuit ANS7 receives the select read signal SRD7 of read address 7 (FIGS. 11 & 12).

The other input terminal of each NAND gate G4 of the gate circuit ANS0 receives one of bit 0 signals DX00, DX10, DX20, ..., DX70 stored in the latches LAS0 to LAS7 of the latch module LAM (note that $DX\alpha\beta$ means an output from the latch module LAM which corresponds to a $\beta$th bit ($\beta=0-7$) of latch $\alpha$($\alpha$=LAS0 to LAS7)). Similarly, the other input terminal of each NAND gate G4 of the gate circuit ANS1 receives one of bit 1 signals DX01, DX11, DX21, ..., DX71 of the latches LAS0 to LAS7 of the latch module LAM. Similarly, the gate circuit ANS7 receives the bit 7 signals DX07, DX17, DX27, ..., DX77. Thus, when the select read signal SRD0 is supplied, the data stored in bits 0 of the latches LAS0 to LAS7 of the latch module LAM are produced (DY00-DY70) from the AND module ANM1. When the select read signal SRD1 is supplied, the data stored in bits 1 of the respective latches are produced (DY01-DY71), and so on. In an output signal $DY\alpha\beta$ of the AND module ANM1, $\alpha$ represents from which latch the output is obtained and also represents the bit position of the output, and $\beta$ represents the address designated by the select read signals SR0 to SRD7 and the bit position of the latches LAS0 to LAS7.

The above relationship will be described with reference to FIGS. 1 and 9 to 12. When the select write signal SWT0 of address 0 is supplied to the latch module LAM and the data b00, b01, ..., b07 shown in FIG. 1 are supplied to the latch module LAM as the data input signals DI0 to DI7, the data b00, b01, ..., b07 are stored in the latch LAS0. When the select write signal SWT1 of address 1 is supplied to the latch module LAM and the data b10 to b17 shown in FIG. 1 are supplied to the latch module LAM as the data input signals DI0 to DI7, these data b10, b11, ..., b17 are stored in the latch LAS1. In this manner, data of column 0 is stored in the latch LAS0, data of column 1 is stored in the latch LAS1, data of column 2 is stored in the latch LAS2, ..., and data of column 7 is stored in the latch LAS7. When data is read out by the AND module ANM1 in response to the select read signals SRD0 to SRD7, bit 0 signals of the respective latches LAS0 to LAS7, i.e., DX00, DX10, ..., DX70 (b00, b10, b20, ..., b70 in FIG. 1) are read out by the select read signal SRD0 of address 0. Similarly, when the select read signal SRD1 of address 1 is supplied, bit 1 signals b01, b11, b21, ..., b71 of row 1 shown in FIG. 1 are read out. In this manner, 8-bit data (DI0 to DI7) are written in the latch module LAM in units of columns 0 to 7 shown in FIG. 1 by the select write signals SWT0 to SWT7. However, in the read mode, the data is read out in units of rows. As a result, output signals DY00 to DY70, DY01 to DY71, ..., DY07 to DY77 from the AND module ANM1 as the bit vertical/horizontal conversion means have been subjected to vertical/horizontal conversion described in the summary of the invention.

The AND module ANM2 will now be described.

Figure 13A:
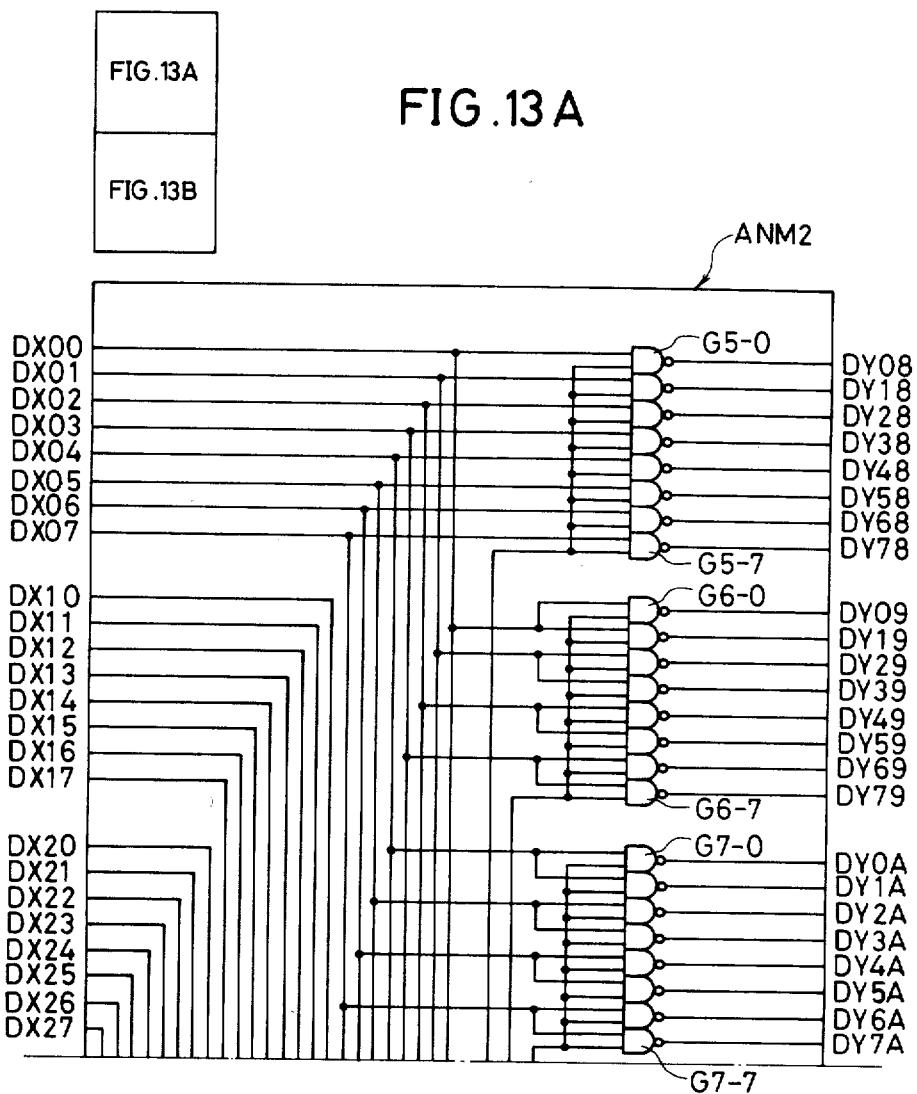
Figure 13:
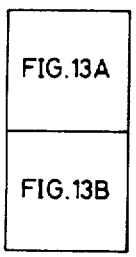
Figure 13:
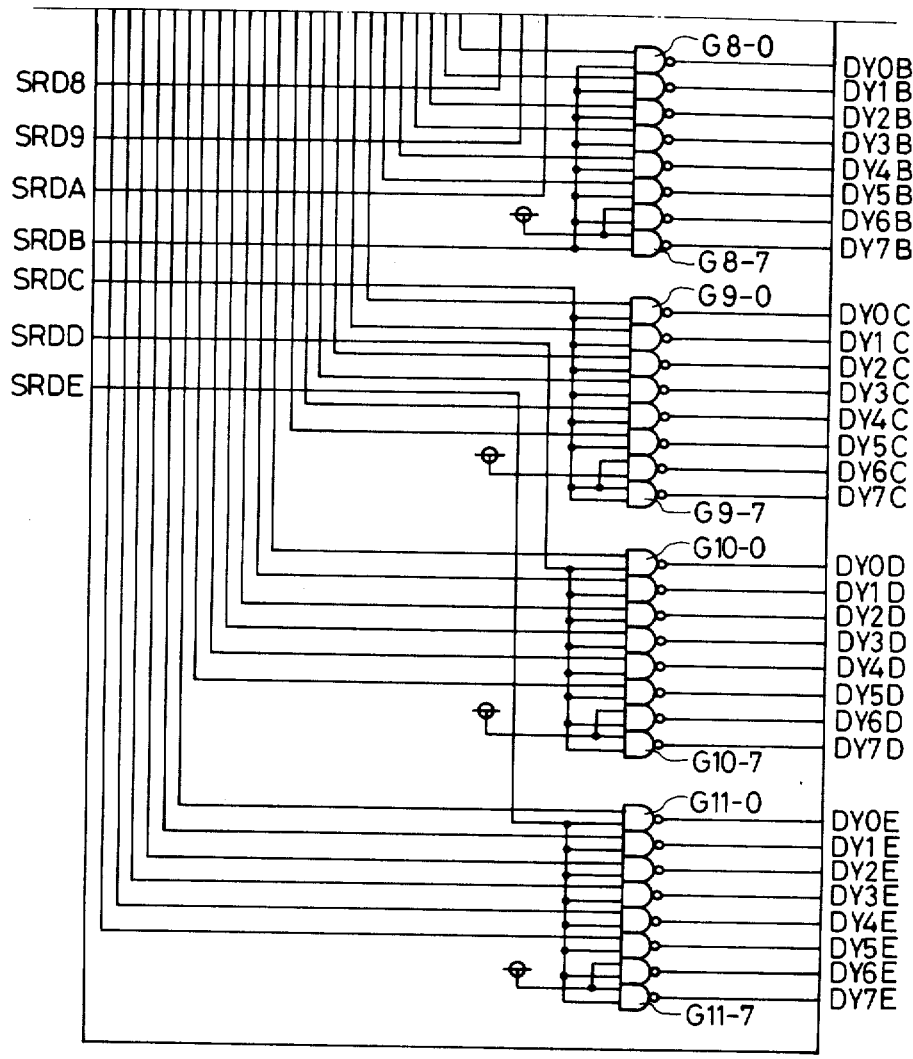

FIG. 13 shows the configuration of the AND module ANM2. Bit 0 to 7 outputs DX00 to DX07 of the latch LAS0 of the latch module LAM are supplied to one input terminal of each of NAND gates G5-0 to G5-7, the other input terminal of which commonly receives the select read signal SRD8 of address 8. Thus, when the select read signal SRD8 of address 8 is supplied, the data stored in bits 0 to 7 of the latch LAS0 of the latch module LAM are produced as data DY08 to DY78. In this case, no bit conversion is performed and the data is produced without any conversion.

NAND gates G6-0 to G6-7 and G7-0 to G7-7 of the double expansion conversion means in the AND module ANM2 will be described below. One input terminal of each of the NAND gates G6-0 to G6-7 commonly receives the select read signal SRD9 of address 9, and one input terminal of NAND gates G7-0 to G7-7 commonly receives the select read signal SRDA of address A. The other input terminal of each of NAND gates G6-0 to G6-7 and the NAND gates G7-0 to G7-7 receives a corresponding one of bit 0 to 7 outputs DX00 to DX07 of the latch LAS0 of the latch module LAM. Note that in this case, the bit 0 output DX00 is supplied to the NAND gates G6-0 and G6-1, the bit 1 output DX01 is supplied to the NAND gates G6-2 and G6-3, and so on, and the bit 7 output DX07 is supplied to the NAND gates G7-6 to G7-7. Thus, when the data stored in the respective bits DX00 to DX07 of the latch LAS0 are represented as d0, d1, d2, ..., d7 as shown in FIG. 3i, the outputs DY09 to DY79 and DY0A to DY7A from the NAND gates G6-0 to G6-7 and G7-0 to G7-7, respectively, become d0, d0, d1, d1, d2, d2, ..., d7, d7 as shown in FIG. 3ii, thus providing double-expanded data.

A description will now be made of the NAND gates G8-0 to G11-7 constituting the bit number conversion means. One input terminal of each of the NAND gates G8-0 to G8-7 commonly receives the select read signal SRDB of address B, and the other input terminal of the NAND gates G8-0 to G8-5 receives a corresponding one of outputs DX00 to DX05 of the latch LAS0. The other input terminal of each of the NAND gates G8-6 and G8-7 receives a signal "1". One input terminal of each of the NAND gates G9-0 to G9-7 commonly receives the select read signal SRDC. The other input terminal of each of the NAND gates G9-0 to G9-5 receives a corresponding one of outputs DX06, DX07, DX10, DX11, DX12 and DX13 from the latch module LAM and the other input terminal of each of the NAND gates G9-6 and G9-7 receives a signal "1". In a similar manner, one input terminal of each of the NAND gates G10-0 to G10-7 commonly receives the select read signal SRDD of address D. The other input terminal of the NAND gates G10-0 to G10-5 receives a corresponding one of outputs DX14 to DX17, DX20 and DX21 from the latch module LAM and the other input terminal of each of the NAND gates G10-6 and G10-7 receives a signal "1". One input terminal of each of the NAND gates G11-0 to G11-7 commonly receives the select read signal SRDE of address E. The other input terminal of each of the NAND gates G11-0 to G11-5 receives a corresponding one of outputs DX22 to DX27 from the latch module LAM and the other input terminal of each of the NAND gates G11-6 and G11-7 receives a signal "1".

Assume that as shown in FIG. 4i the data d0 to d7 are stored in bits 0 to 7 of the latch LAS0, the data d8 to d15 are stored in the latch LAS1, and the data d16 to d23 are stored in the latch LAS2. When the select read signals SRDB, SRDC, SRDD and SRDE are supplied in this case, outputs DY0B to DY7B from the AND module ANM2 become d0, d1, d2, d3, d4, d5, "1", and "1", as shown in FIG. 4ii. Similarly, outputs DY0C to DY7C become d6 to d11, "1" and "1", and outputs DY0B to DY0E become as shown in FIG. 4ii. In this manner, conversion from an 8-bit pattern into a 6-bit pattern is performed.

The OR module ORM will be described below.

Figure 14:
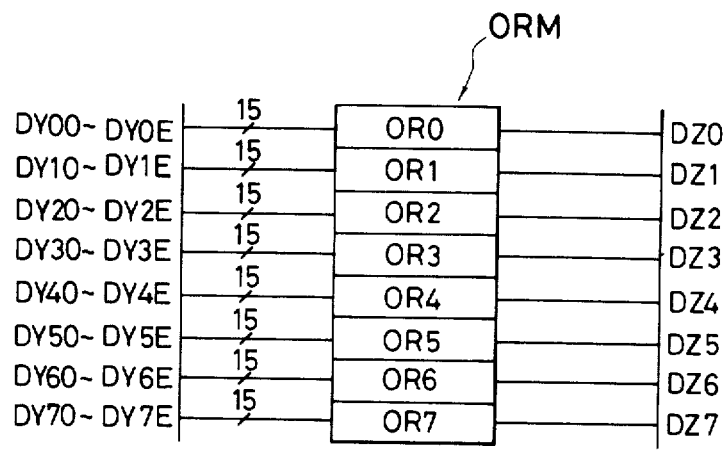
FIG. 14 is a circuit diagram of an OR module.
Figure 15:
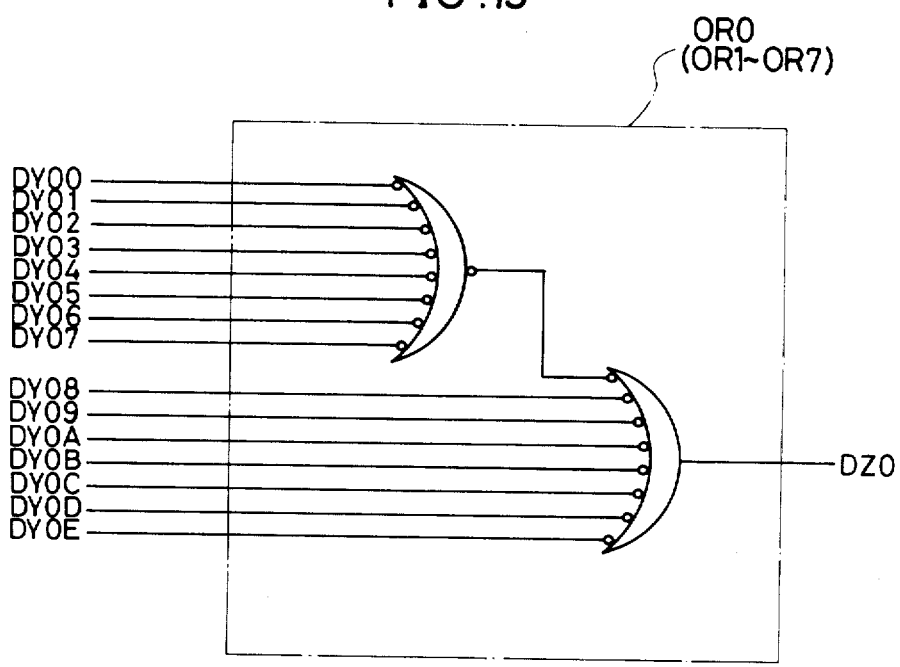
FIG. 15 is a circuit diagram of an OR circuit.

FIG. 14 shows the configuration of the OR module ORM. The OR module ORM consists of 8 OR circuits as shown in FIG. 15 (OR circuit OR0 is exemplified in FIG. 15). The OR circuit OR0 produces the bit 0 data (DZ0) when accessed by addresses 0 to E. The OR circuit OR1 produces bit 1 data (DZ1) when accessed by addresses 0 to E, and so on. Finally, the OR circuit OR7 produces bit 7 data (DZ7) when accessed by addresses 0 to E.

The select module SEM as the MSB/LSB conversion means will be described.

Figure 16:
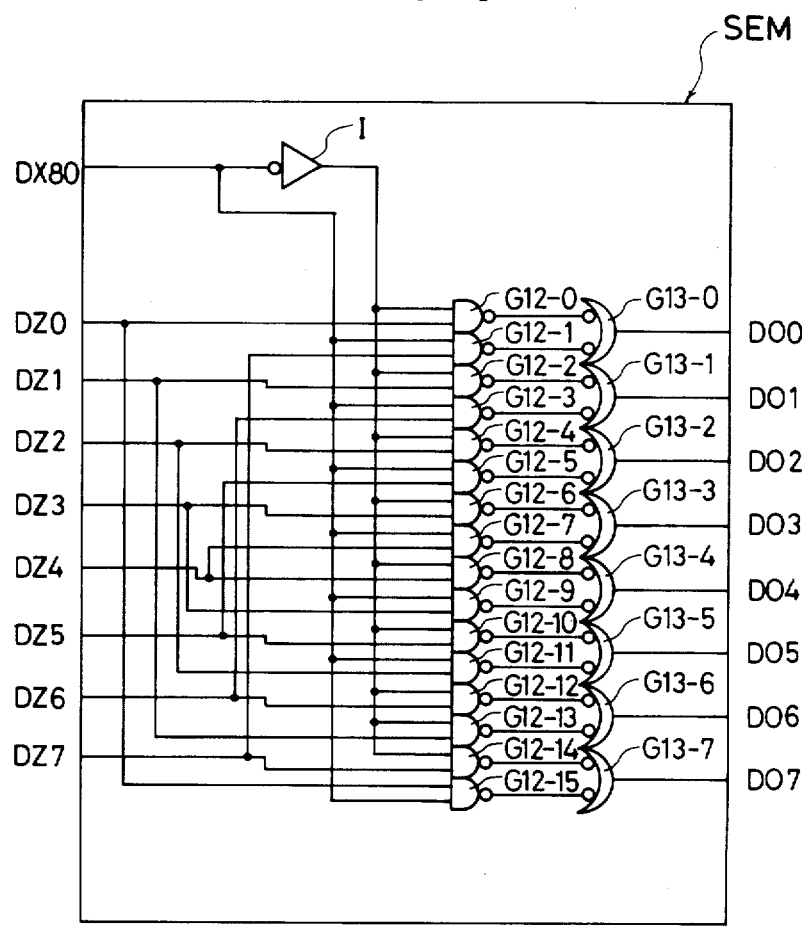
FIG. 16 is a circuit diagram of a select module.

FIG. 16 shows the configuration of the select module. Referring to FIG. 16, reference symbols G12-0 to G12-15 denote NAND circuits; G13-0 to G13-7, NOR circuits; and I, an inverter. An output DX80 from the control latch COT of the latch module LAM is inverted by the inverter I and the inverted signal is supplied to the NAND circuits G12-0, G12-2, G12-4, G12-6, G12-8, G12-10, G12-12, and G12-14.

The other input terminal of each of those NAND circuits receives a corresponding one of outputs DZ0 to DZ7 of the OR module ORM. In this manner, the output DZ0, a bit 0 output, is supplied to the NAND circuit G12-0, the bit 1 output DZ1 is supplied to the NAND circuit G12-2, the bit 2 output DZ2 is supplied to the NAND circuit G12-4, the bit 3 output DZ3 is supplied to the NAND circuit G12-6, ..., and the bit 7 output DZ7 is supplied to the NAND circuit G12-14. The output DX80 from the control latch COT of the latch module LAM is supplied to one input terminal of each of the NAND circuits G12-1, G12-3, G12-5, G12-7, G12-9, G12-11, G12-13, and G12-15. The other input terminal of each of these NAND circuits receives the outputs DZ7 to DZ0 in the reverse order to that in the above case; the output DZ7, as the bit 7 output, from the OR module is supplied to the NAND circuit G12-1, the bit 6 output DZ6 is supplied to the NAND gate G12-3, ..., and the bit 0 output DZ0 is supplied to the NAND gate G12-15. Outputs from the NAND gates G12-1 to G12-1 are supplied to a NOR circuit G13-0. Outputs from the NAND circuits G12-2 and G12-3 are supplied to a NOR circuit G13-1. Outputs from the NAND circuits G12-4 and G12-5 are supplied to a NOR circuits G13-2, and so on, and outputs from the NAND circuits G12-14 and G12-15 are supplied to a NOR circuit G13-7. As a result, when the output DX80 from the control latch COT is "0", the outputs DO0 to DO7 from the select module SEM are the outputs DZ0 to DZ7 from the OR module ORM. When the output DX80 from the control latch COT is "1", the output DO0 from the select module SEM is the output DZ7 from the OR module ORM. The output DO1 is the output DZ6, the output DO2 is the output DZ5, ..., and the output DO7 is the output DZ0. Referring to the example shown in FIG. 2, assume that data d0 to d7 as shown in FIG. 2i are produced as the outputs DZ0 to DZ7. When the output DX80 from the control latch COT is "0", the output data d0 to d7 are directly produced with the same pattern as the outputs DO0 to DO7 of the select module SEM. However, when the output DX80 from the control latch COT is "1", MSB/LSB conversion is performed and the bit pattern as shown in FIG. 2ii is produced as the outputs DO0 to DO7 from the select module SEM.

The outputs DO0 to DO7 from the select module SEM are respectively supplied to the drivers DR, as shown in FIG. 6. The respective drivers DR are energized in response to the data output enable signal DOE from the decoder means DEM and when energized produce the outputs DO0 to DO7 from the select module SEM as the outputs from the bit pattern conversion apparatus 6.

The operation of the overall apparatus of this embodiment will be described.

Assume that the CPU 3 produces the chip select signal $\overline{CS}$ and the write signal $\overline{W}$, and address 0, for example, is designated by the address signals A0 to A3. Then, as illustrated in FIG. 6 and described with reference thereto, the latch address signal SEL0 from the decoder DE1 alone becomes "0", and the remaining latch address signals SEL1 to SELE become "1". Then, the gate segment SA0 of the gate module GSA1 produces the select read signal SRD0 and the select write signal SWT0. When the select write signal SWT0 is produced, as shown in FIGS. 9 and 10, the latch LAS0 of the latch module LAM is selected and the data (DI0 to DI7) from the data bus is written in the latch LAS0. In a similar manner, data is written in the latches LAS0 to LAS7 of the latch module LAM at the addresses 0 to 7 which are accessed by the address signals A0 to A3. When the select read signal SRD0 is produced from the decoder means DEM, it is supplied to the AND mcdule ANM1 and the gate circuit ANS0 is selected. Then, as described above, the bit 0 data DX00 to DX70 stored in the respective latches LAS0 to LAS7 of the latch module LAM are read out. In a similar manner, bit 0 to 7 outputs DY00–DY70 to DY07 to DY77 from the latches LAS0 to LAS7 of the latch module LAM are produced (e.g., DY07 represents bit 7 of the latch LAS0). In this manner, when addresses 0 to 7 are designated, as shown in FIG. 1, the respective data are produced from the AND module NM1 after vertical/horizontal conversion. These outputs DY00 to DY77 are supplied to the OR module ORM such that the bit 0 to 7 outputs from the respective latches are supplied to the OR circuits OR0 to OR7, and the outputs DZ0 to DZ7 are produced from the OR module ORM.

In the example described above, assume a case wherein address 0 is selected, the select read SRD0 is produced, bit 0 data of the latches LAS0 to LAS7 of the latch module LAM is produced from the AND module ANM1. Then, bit 0 data from the latch LAS0 is produced as the output DZ0 of the OR module ORM. Bit 0 data of the latch LAS1 is produced as the output DZ1, and so on, and bit 0 data of the latch LAS7 is produced as the output DZ7. These outputs are supplied to the select module SEM as the MSB/LSB conversion means. As has been described above, if the output DX80 from the control latch COT as an MSB/LSB conversion command signal is "0", MSB/LSB conversion is not performed and the vertical/horizontal conversion bit pattern data is produced from the bit pattern conversion apparatus 6. If the output DX80 from the control latch COT is "1", the bit pattern data is subjected to MSB/LSB conversion and is produced. Thus, the bit pattern conversion apparatus 6 produces data which has been subjected to vertical/horizontal conversion and MSB/LSB conversion.

In the above description, addresses 0 to 7 are accessed by the address signals A0 to A3. A case will now be described wherein address 8 is selected. When address 8 is selected, the decoder means DEM produces the select write signal SWT8 (when the write command signal WT is received) and the select read signal SRD8. When the select write signal SWT8 is supplied to the latch module LAM, as shown in FIG. 9, the control latch COT is selected. Input signals DI0 to DI7 are written in the control latch COT. In this case, since the data of bit 0 only is used as a control signal for MSB/LSB conversion, the bit 0 signal DI0 among the data input signals DI0 to DI7 is set at "1" when MSB/LSB conversion is performed but it is set at "0" when MSB/LSB conversion is not performed. Data is thus written.

Meanwhile, the select read signal SRD8 is supplied to the AND module ANM2. As shown in FIG. 13, the outputs DX00 to DX07 from the latch LAS0 of the latch module LAM are selected and produced as the outputs DY08 to DY78. These outputs DY08 to DY78 are supplied to the select module SEM through the OR module ORM. If the signal DX80 from the control latch COT is "1", MSB/LSB conversion as described above is performed and the converted data is produced. However, when address 8 is selected, only MSB/LSB conversion is performed, as shown in FIG. 2.

When addresses 9 and 10 are selected, the decoder means DEM supplies the select read signals SRD9 and SRDA to the AND module ANM2. The AND module ANM2 doubles the outputs DX00 to DX07 from the latch LAS0 of the latch module, as described above, and produces outputs DY09 to DY79 and DY0A to DY7A. These outputs are produced through the OR module ORM and the select module SEM (if MSB/LSB conversion is not performed at the select module). The bit pattern conversion apparatus 6 produces the double-expanded outputs DO0 to DO7, as shown in FIG. 3ii.

When addresses 11, 12, 13 and 14 are selected, the decoder means DEM supplies the select read signals SRDB, SRDC, SRDD and SRDE to the AND module ANM2. As illustrated in FIG. 13 and described with reference thereto, the 8-bit outputs DX00 to DX07, DX10 to DX17, and DX20 to DX27 from the latches LAS0, LAS1 and LAS2 of the latch module LAM are produced as 6-bit outputs DY0B to DY7B, DY0C to DY7C, DY0D to DY7D, and DY0E to DY7E as shown in FIG. 4ii. These outputs are similarly produced through the OR module ORM and the select module SEM. In this manner, 6-bit pattern data can be obtained from 8-bit pattern data. The converted bit pattern data can be supplied to the printer or CRT display unit compatible therewith.

What is claimed is:

1. A bit pattern conversion apparatus for use witha central porocessing unit, comprising:
　　data latch means including n groups of memory sections, each group of said memory sections having m data input terminals, a data write terminals for receiving a data write signal, and m memory elements each arranged to permit to independently write data information thereinto and independently read out same therefrom, for storing therein data supplied to said m input terminals in response to the data write signal, said data latch means constituting an m-row by n-column matrix memory circuit;
　　first data readout means including m groups of gate sections which constitute row-column conversion means, each group of gate sections having n logical product circuits having first and second input terminals, the first input terminals of said n logical product circuits of one section of said m groups of gate sections being connected respectively to n memory elements of one row of said data latch means, the second input terminals of said n logical product circuits being connected in common to form a data readout terminal for a corresponding one group of gate sections and for receiving a data readout signal, the data readout signals for the m groups of gate sections being supplied independently of each other;

second data readout means including plural groups of gate sections which constitute at least one of a non-conversion means, an expansion conversion means and an 8-bit to 6-bit conversion means, each group of gate sections having m logical product circuits having first and second input terminals, the first input terminals of said m logical product circuits of one of said plural groups of gate sections being connected to predetermined memory elements of a predetermined number of groups of sections of said data latch means, the second input terminals of the m logical product circuits of one of said plural groups of gate circuit being connected in common to form a data readout terminal for a coresponding one group of gate sections for receiving a data readout signal, the data readout signals for said plural groups of gate sections being supplied independently of each other;

a logical sum circuit including m logical sum gates each operable to logically sum up outputs supplied from corresponding ones of the gate elements of said first and second data readout means;

a MSB/LSB conversion circuit including m select gate means each having a first and second input terminals and select terminals, the first input terminals of the m select gates being connected to the m logical sum gates of said logical sum circuit in a first order, the second input terminals of the m selected gates being connected to the m logical sum gates of said logical sum circuit (ORM) in a second, reverse order, each of the m select gate means being adapted to be connected to said logical sum circuit, so that either one of the first and second input terminals is selected in accordance with the presence or absence of a select signal supplied to the select terminals; and decoder means operable in accordance with a command from said central processing unit for sending the data write signals to the data write terminals of said data latch means, and for sending the data readout signals to the data readout terminals of said first and second data readout means, and for supplying the select signal to the select terminals of said MSB/LSB conversion circuit.

2. A bit pattern conversion apparatus according to claim 1, wherein said decoder means is operable to send a readout signal for non-conversion; said second data readout means having a group of gate sections for non-conversion which has m logical product circuits each having first and second input terminals, the first input terminals of said m logical product circuits of said gate section being connected to corresponding memory elements arranged in a predetermined column of said data latch means, the second input terminals of said m logical product circuits of said gate section being connected in common to form a data read out terminal for receiving a non-conversion data readout signal; said second data readout means being operable to read out the data stored in said data latch means in response to the data readout signal for non-conversion, with the data kept unchanged in their order between write and readout operations.

3. A bit pattern conversion apparatus according to claim 1, wherein said second data readout means has first and second groups of gate sections for expansion conversion each group of which consists of m logical product circuits having first and second input terminals; the first input terminals of the m logical product circuits of the first group of gate section heing connected in common by one pair to form m/2 pairs of associated input terminals which are connected to memory elements located at locations from the first row to the m/2th row in a predetermined column of said data latch means, and the second input terminals of the m logical product circuit of the first group of gate section being connected in common to form a data readout terminal for receiving a data readout signal for the first group of gate section, which is supplied from said decoder means; and the first input terminals of the m logical product circuit of second group of gate section being connected in common by one pair to form m/2 pairs of associated input terminals which are connected to memory elements located at locations from the $(m/2+1)$th row to the mth row in said predetermined one column of said data latch means, and the second input terminals of the m logical product circuit of the second group of gate section being connected in common to form a data readout terminal for receiving a data readout signal for the second group of gate section, which is supplied from said decoder means; whereby one-bit information data are converted into two-bit information data each having the same data content as one memory element of said predetermined column of said data latch means.

4. A bit pattern conversion apparatus according to claim 1, wherein said 8bit to 6-bit conversion means has four groups of gate sections for 8-bit to 6-bit conversion, each group having eight logical product circuits having first and second input terminals, which are divided into a first set consisting of six circuits and a second set consisting of two circuits; the first input terminals of logical product circuits of said first sets being connected to memory elements which form arbitrarily selected three columns of said data latch means which are arranged to be continuous to each other; the first input terminals of logical product circuits of said second sets being supplied with logic "1" data; and the second input terminals of each group of gate sections being connected in common to form respective readout terminals for receiving data readout signals for 8-bit to 6-bit conversion which are supplied from said decoder means; whereby 6-bit information data which are separated from each other by two logic "1" data are obtained from 8-bit information data stored in said data latch means.

5. A bit pattern conversion apparatus according to claim 1, wherein said MSB/LSB conversion circuit comprises m select gate means including m pairs of logical product gates each consisting of first and second logical product gates each of which have first and second input terminals, and m logical sum gates each having first and second input terminals, and output terminals of said first logical product gates being connected to the first input terminals of said logical sum gates and output terminals of said second logical product gates being connected to the second input terminals of said logical sum gate; the first input terminals of the first gates of said m pairs of logical product gates being connected to the output terminals of the m logical sum gates of said logical sum circuit in an order; the first input terminals of the second gates of said m pairs of logical product gates being connected to the output terminals of the m logical sum gates of said logical sum circuit in a reverse order to said m pairs of logical product gates being connected to a select signal output terminal of said decoder means for sending the MSB/LSB select signal through an inverter; and second input terminals of the second gates to the select signal output terminal of said decoder means; whereby MSB/LSB conversion is performed.

* * * * *